United States Patent [19]

Nagai

[11] 4,149,189
[45] Apr. 10, 1979

[54] TELEVISION RECEIVER WITH DISPLAY OF AUDIO SIGNALS

[75] Inventor: Kunio Nagai, Tokyo, Japan

[73] Assignee: Sony Corporation, Tokyo, Japan

[21] Appl. No.: 849,438

[22] Filed: Nov. 7, 1977

[30] Foreign Application Priority Data

Nov. 15, 1976 [JP] Japan .......................... 51/153003[U]

[51] Int. Cl.² .............................................. H04N 9/62
[52] U.S. Cl. .................................................... 358/139
[58] Field of Search ......................... 358/139, 185, 198

[56] References Cited

U.S. PATENT DOCUMENTS 3,337,684  8/1967  Sadler .................................... 358/139

OTHER PUBLICATIONS

"Use Your TV Set As An Oscilloscope", Southworth, Radio & TV News–pp. 66, 67, 158, Apr. 1958.

Primary Examiner—Robert L. Richardson
Attorney, Agent, or Firm—Lewis H. Eslinger; Alvin Sinderbrand

[57] ABSTRACT

In a television receiver for selectively displaying a received television picture and an audio signal waveform on the screen of a cathode ray tube, an audio signal to be displayed is applied to a pulse generation circuit where it is converted to a waveform display pulse signal having the phase position corresponding to the audio signal and this waveform display signal is applied to a video amplifier every other field during the display of the audio signal waveform, whereby a viewer can clearly see the audio signal waveform on the screen of the cathode ray tube.

3 Claims, 3 Drawing Figures

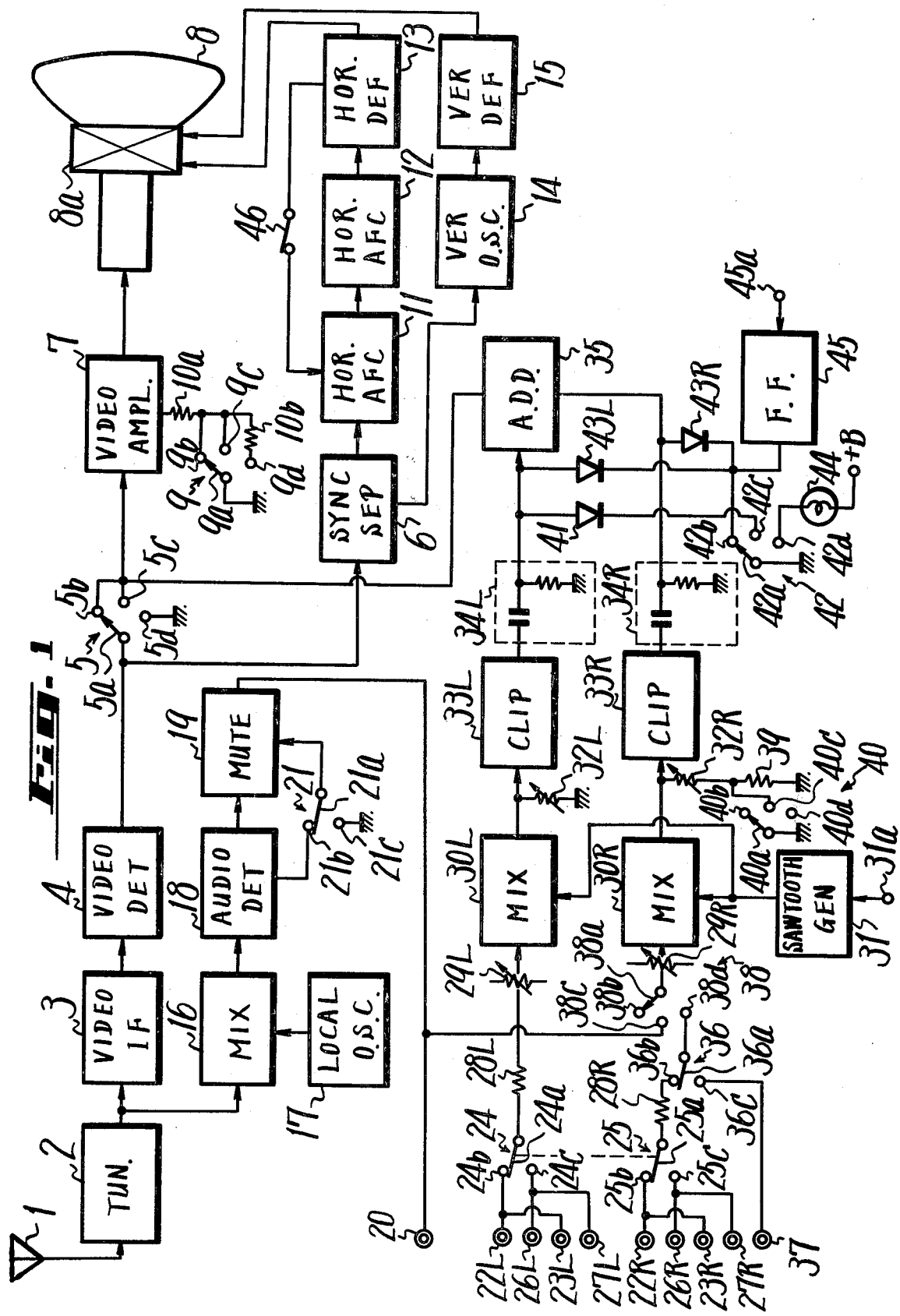

TELEVISION RECEIVER WITH DISPLAY OF AUDIO SIGNALS

BACKGROUND OF THE INVENTION

1. Field of the Invention

The present invention relates to a television receiver, and more particularly to a television receiver for selectively displaying a received television picture and an audio signal waveform on the screen of a cathode ray tube.

2. Description of the Prior Art

It is often desirable to monitor the signal levels of a number of signal channels, for example, of a stereo signal in a sound tape recording apparatus. In most sound tape recording apparatus, a VU meter is used to set a signal level to be fed. In this case, however, the conventional VU meter does not provide an accurate indication of a signal level, because the needle of the VU meter indicates only its average value. Further, a conventional oscilloscope accurately displays the waveform of an input signal on the screen of a cathode ray tube. However, such an oscilloscope is very expensive and impossible to display a television picture on the screen of its cathode ray tube.

SUMMARY OF THE INVENTION

It is an object of this invention to provide an improved television receiver free from the above described drawback.

It is another object of this invention to provide a television receiver for displaying an audio signal waveform on the screen of a cathode ray tube.

It is a further object of this invention to provide a television receiver in which a viewer can clearly see particularly an audio signal waveform as well as a television picture on the screen of a cathode ray tube.

In accordance with an aspect of this invention, a television receiver for selectively displaying a television picture and an audio signal waveform on the screen of a cathode ray tube comprises a first input device for receiving a video signal representing the television picture, a second input device for receiving an audio signal having a waveform to be displayed, a circuit connected to the second input device for converting the audio signal to a waveform display pulse signal having the phase position corresponding to the audio signal, a selecting device for selectively applying the video signal to a video amplifier connected to the cathode ray tube during the display of the television picture, and a control device connected to the signal converting circuit for controlling the waveform display pulse signal so as to be applied to the video amplifier every other field during the display of the audio signal.

The other objects, features and advantages of this invention will be apparent from the following description taken in conjunction with the accompanying drawings.

BRIEF DESCRIPTION OF THE DRAWINGS

FIG. 1 is a block diagram showing one example of a television receiver according to this invention.

DESCRIPTION OF THE PREFERRED EMBODIMENT

Figure 2A:
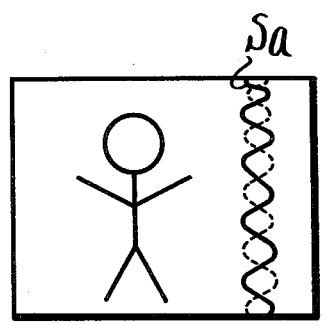
FIGS. 2A and 2B are views respectively used for explaining this invention.

A description will hereinafter be given on one example of this invention with reference to the drawings.

In FIG. 1, a television broadcasting signal received by an aerial 1 is supplied to a tuner 2 and the output signal therefrom is fed through a video intermediate frequency amplifier 3 to a video detector circuit 4. The output of the video detector circuit 4 is applied to a movable contact 5a of a change-over switch 5 and also to a synchronizing (sync) separator circuit 6 at its input side. The first fixed contact 5b of the switch 5 and the second fixed contact 5c thereof are connected together and further connected to a video amplifier 7 at its input side, while the third fixed contact 5d thereof is grounded. The output signal of the video amplifier 7 is supplied to the cathode of a cathode ray tube 8.

The brightness control terminal of the video amplifier 7 is connected through a brightness adjusting variable resistor 10a to first and second fixed contacts 9b and 9c of a brightness change-over switch 9. Further, the connection point between variable resistor 10a and both fixed contacts 9b and 9c is connected through a resistor 10b for changing the reference level of brightness adjustment to the third fixed contact 9d of the switch 9, while the movable contact 9a of the change-over switch 9 is grounded. The resistor 10b serves to adjust the brightness of the cathode ray tube 8 by the brightness change-over switch 9 to provide an easy view of a waveform.

A horizontal sync signal obtained at one output terminal of the sync separator circuit 6 is delivered to a horizontal automatic frequency control (AFC) circuit 11 at its one input terminal and a control signal obtained therefrom is supplied to a horizontal oscillator 12 at its frequency control terminal. The output signal of the horizontal oscillator 12 is fed to a horizontal deflection circuit 13 to derive therefrom a horizontal deflection signal which is applied to a deflection coil 8a of the cathode ray tube 8. Further, the horizontal frequency signal from the horizontal deflection circuit 13 is supplied through a connection switch 46, which will be described later, to the other input terminal of the horizontal AFC circuit 11. In the horizontal AFC circuit 11, as well known, the horizontal sync signal supplied from the sync separator circuit 6 is compared with the horizontal frequency signal derived from the horizontal deflection circuit 13 to produce a control signal corresponding to an error signal. This control signal is fed to the horizontal oscillator 12 to control its oscillation frequency.

A vertical sync signal obtained at the other output terminal of the sync separator circuit 6 is delivered to a vertical oscillator 14 as its sync signal and the output signal thereof is fed to a vertical deflection circuit 15. A vertical deflection signal obtained from the vertical deflection circuit 15 is then applied to the deflection coil 8a of the cathode ray tube 8.

The output signal of the tuner 2 is also supplied to one input terminal of an audio signal mixing circuit 6 for producing an audio signal, while an output signal of an audio signal local oscillator 17 is applied to the other input terminal of the mixing circuit 16. The output signal of the mixing circuit 16 is then fed to an audio detector circuit 18 and the output signal thereof is supplied through a muting circuit 19 to an audio signal output terminal 20 from which is fed an audio signal to a speaker. In this case, there is provided a change-over switch 21 between both circuits 18 and 19. With a movable contact 21a of the change-over switch 21 being connected to its one fixed contact 21b as illustrated, when the output signal of the audio detector 18 disappears for a predetermined time or the level of the output signal thereof is kept lower than a predetermined level for a predetermined time, the muting circuit 19 operates for muting the output signal. Meanwhile, when the movable contact 21a of the switch 21 is connected to the other fixed contact 21c, the muting circuit 19 is not allowed to carry out the muting operation.

Reference numerals 22L and 22R represent input terminals for stereo left- and right-channel recording signals, respectively. The left- and right-channel recording signals from the recording signal input terminals 22L and 22R are respectively delivered to left- and right-channel recording signals output terminals 23L and 23R, and also fed to respective fixed contacts 24b and 25b of the change-over switches 24 and 25, respectively. Reference numerals 26L and 26R indicate input terminals applied with left- and right-channel signals of a stereo signal from, for example, a tape recorder. The left- and right-channel signals from these input terminals 26L and 26R are respectively applied through output terminals 27L and 27R to speakers (not shown) and also to the respective other fixed contacts 24c and 25c of the switches 24 and 25. In this case, the respective movable contacts 24a and 25a of the switches 24 and 25 are linked with each other. That is, when the movable contact 24a is connected to one fixed contact 24b, the movable contact 25a is connected to one fixed contact 25b, while then the movable contact 24a is connected to the other fixed contact 24c, the movable contact 25a is connected to the other fixed contact 25c.

The movable contact 24a of the switch 24 is connected through a resistor 28L having a relatively high resistance value and a gain controller 29L to a mixing circuit 30L at its one input terminal. In this mixing circuit 30L, an audio signal for displaying its waveform is fed to the one input terminal thereof and superimposed on a sawtooth wave signal from a sawtooth wave signal generating circuit 31 which produces a sawtooth wave signal in synchronism with the horizontal flyback pulse derived from the horizontal deflection circuit 13. Reference numeral 31a denotes a horizontal pulse input terminal to which is fed the horizontal flyback pulse derived from the horizontal deflection circuit 13. The output side of the mixing circuit 30L is grounded through a variable resistor 32L for adjusting the waveform display position and also connected to a Schmitt trigger circuit 33L forming a clipper circuit. The signal obtained from the Schmitt trigger circuit 33L is supplied through a differentiation circuit 34L and an adding circuit 35 to the video amplifier 7 at its input side. The differentiation circuit 34L has derived therefrom a phase-modulated waveform-display pulse signal of, for example, positive direction.

The movable contact 25a of the switch 25 is connected through a resistor 28R having a relatively high resistance value to one fixed contact 36b of a multipath signal display change-over switch 36, while a multipath signal input terminal 37 is connected to the other fixed contact 36c of the switch 36. The terminal 37 is applied with a multipath signal from an FM radio receiver (not shown). The movable contact 36a of the change-over switch 36 is connected to a third fixed contact 38d of a display content change-over switch 38 and the second fixed contact 38c thereof is connected to the audio signal output terminal 20. The second fixed contact 38c is also applied with an audio signal in the television broadcasting signal, while the first fixed contact 38b of the display content change-over switch 38 is electrically isolated.

The movable contact 38a of the display content change-over switch 38 is connected through a gain controller 29R to a mixing circuit 30R at its one input terminal. The sawtooth wave signal in synchronism with a horizontal pulse from the sawtooth wave signal generating circuit 31 is supplied to the other input terminal of the mixing circuit 30R, wherein a signal for displaying its waveform is superimposed on the sawtooth wave signal in synchronism with the horizontal pulse. The output side of this mixing circuit 30R is grounded through a series circuit consisting of display position adjusting variable resistor 32R and resistor 39. The connection point between variable resistor 32R and resistor 39 is connected to a second fixed contact 40c of a display position adjusting change-over switch 40 with first and third fixed contacts 40b and 40d being electrically isolated and its movable contact 40a being grounded.

The mixing circuit 30R is also connected to a Schmitt trigger circuit 33R forming a clipper circuit and a signal derived therefrom is applied through a differentiation circuit 34R and the adding circuit 35 to the input side of the video amplifier 7. In this case, the differentiation circuit 34R has derived therefrom a phase-modulated waveform display pulse signal of, for example, positive direction during every horizontal interval similarly as the differentiation circuit 34L.

To sum up, signals to be displayed such as an audio signal and the like from the gain controllers 29L and 29R are supplied to the mixing circuits 30L and 30R to be mixed with the sawtooth wave signal in synchronism with the horizontal pulse applied from the sawtooth wave signal generating circuit 31. The output signals of the mixing circuits 30L and 30R are supplied to the Schmitt trigger circuits 33L and 33R where the phases at clipping point are changed in proportion to the amplitude of, for example, an audio signal, that is, phase modulation is carried out. Thus phase-modulated signals are fed to the differentiation circuits 34L and 34R to derive therefrom respective phase-modulated positive pulse signals during every horizontal interval which are applied through the adding circuit 35 to the input side of the video amplifier 7 to display a horizontally moving vertical bright line on the screen of the cathode ray tube 8.

The output side of the differentiation circuit 34L is connected through a diode 41 to a second fixed contact 42c of a change-over switch 42. The differentiation circuits 34L and 34R are also connected through diodes 43L and 43R to the first fixed contact 42b of the switch 42, while the third fixed contact 42d thereof is connected through a stereo display lamp 44 to a voltage source terminal +B to which a positive DC voltage is supplied, the movable contact 42a of this switch 42 being grounded.

In this case, the change-over switches 5, 38, 40 and 42 cause their movable contacts 5a, 38a, 40a and 42a to be linked with one another. In other words, when only a television picture is intended to be displayed on the screen of the cathode ray tube 8, the movable contacts 5a, 38a, 40a and 42a are respectively connected to the corresponding first fixed contacts 5b, 38b, 40b and 42b.

Thus, the respective output sides of the differentiation circuits 34L and 34R are grounded through diodes 43L and 43R so that the output signals of the differentiation circuits 34L and 34R may not be fed to the video amplifier 7. Only the output signal of the video detector circuit 4 is supplied through the switch 5 to the video amplifier 7.

When a television picture and a waveform $S_a$ of an audio signal in the television broadcasting signal are simultaneously displayed on the screen of the cathode ray tube 8 as shown in FIG. 2A, the movable contacts 5a, 38a, 40a and 42a are respectively connected to the corresponding second fixed contacts 5c, 38c, 40c and 42c. In this case, the output signal of the video detector circuit 4 is fed through the switch 5 to the video amplifier 7, while the audio signal in a television broadcasting signal is applied through the switch 38 to the gain controller 29R and the connection between second fixed contact 40c and movable contact 40a permits to move a position of a bright line of the audio signal to one side on the screen, or to the right side in the example of FIG. 2A. The output signal of the differentiation circuit 34L is grounded through diode 41 and switch 42.

Figure 2B:
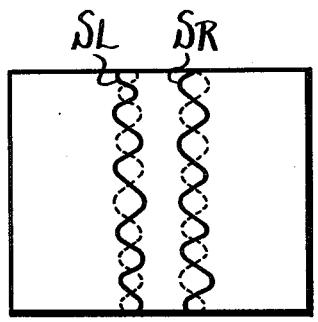

When two waveforms $S_L$ and $S_R$ of a stereo signal obtained at the movable contacts 24a and 25a of the switches 24 and 25 are intended to be displayed on the screen of the cathode ray tube 8 as shown in FIG. 2B, the movable contacts 5a, 38a, 40a and 42a respectively connected to the third fixed contacts 5d, 38d, 40d and 42d, and the movable contact 36a of the multipath signal display change-over switch 36 is connected to the fixed contact 36b. In this case, the output signal of the video detector circuit 4 is not supplied to the video amplifier 7 because, of the connection in the switch 5, and also the stereo display lamp 44 is lighted.

When the movable contacts 5a, 38a, 40a and 42a are respectively connected to the corresponding third fixed contacts 5d, 38d, 40d and 42d with the movable contact 36a of the multipath signal display change-over switch 36 being connected to the other fixed contact 36c, the multipath signal can be displayed on the screen of the cathode ray tube 8 and hence the television receiver can be used as a measuring device.

Further, in this example, the connection switch 46 is inserted between the horizontal deflection circuit 13 and the other input terminal of the horizontal AFC circuit 11. Normally, the connection switch 46 is closed. However, when the waveforms of stereo signal or the like obtained at the movable contacts 24a and 25a of the switches 24 and 25 are displayed on the screen of the cathode ray tube 8 with the movable contacts 5a, 38a, 40a and 42a being respectively connected to their third fixed contacts 5d, 38d, 40d and 42d, the connection switch 46 is opened.

With the above described construction, the connection switch 46 is normally closed so that the television receiver operates similarly as usual. On the other hand, when the waveforms of stereo signal obtained at the movable contacts 24a and 25a of the switches 24 and 25 are displayed on the screen of the cathode ray tube 8 with the movable contacts 5a, 38a, 40a and 42a of the switches 5, 38, 40 and 42 being respectively connected to their corresponding third fixed contacts 5d, 38d, 40d and 42d, the connection switch 46 is opened to make the horizontal oscillator 12 in a free oscillating condition. That is, the horizontal oscillator 12 starts to oscillate at its original frequency or horizontal frequency. Accordingly, even when a television broadcasting signal disappears to eliminate a horizontal sync signal to be supplied to one input terminal of the horizontal AFC circuit 11, the waveform on the screen of the cathode ray tube 8 is not disturbed without being affected by noises fed to the aforementioned one input terminal with the result that a good waveform can be displayed.

However, in a case of displaying the waveform of an audio signal on the screen of a cathode ray tube, if both of waveform display pulse signals obtained in odd-numbered field and even-numbered field are displayed, and the waveform display pulse signal in, for example, odd-numbered field has a waveform as shown in FIG. 2A by a solid line, the waveform relating to the display pulse signal in even-numbered field is distorted in phase as shown by a dotted line due to the interlace scanning. As a result, two waveforms are overlapped as a picture image of one frame to cause a quite indistinct view. Particularly, the waveform of an audio signal is extremely obscure because of its irregularity.

In order to eliminate the above defect, a flip-flop circuit 45 is used in this example. That is, the flip-flop circuit 45 is applied at its trigger pulse input terminal 45a with a vertical pulse from the vertical deflection circuit 15. The output terminal of the flip-flop circuit 45 is connected to the cathodes of the diodes 43L and 43R, respectively, to make the diodes 43L and 43R conductive every other field.

With the above described arrangement of this invention, when the waveform relating to an audio signal is displayed on the screen of the cathode ray tube 8, that is, the movable contact 42a of the switch 42 is connected to the second or third fixed contact 42c or 42d, a voltage at the output terminal of the flip-flop circuit 45 changes its value between source voltage and zero voltage at every supply of a vertical pulse to the trigger pulse input terminal 45a to make the diodes 43L and 43R conductive every other field. At this time, the output signals of the differentiation circuits 34L and 34R are absorbed into the ground through the diodes 43L and 43R and not supplied to the adding circuit 35. Accordingly, the waveform or waveforms of display pulse signals obtained only in an even-numbered field or an odd-numbered field are displayed on the screen of the cathode ray tube 8. In other words, for example, the waveform or waveforms shown by only the solid lines in FIG. 2A or 2B can be obtained, so that the waveform of an audio signal becomes distinct to provide an improved display effect.

It will be obvious that a number of changes and variations can be effected without departing from the scope of the novel concepts of this invention.

I claim as my invention:

1. A television receiver for selectively displaying a television picture and an audio signal waveform on the screen of a cathode ray tube comprising:
   a. first input means for receiving a video signal representing the television picture;
   b. second input means for receiving an audio signal having a waveform to be displayed;
   c. means coupled to said second input means for converting said audio signal to a waveform display pulse signal having the phase position corresponding to said audio signal;
   d. selection means for selectively applying said video signal to a video amplifier coupled to the cathode ray tube during the display of the television picture; and e. means coupled to said signal converting means for controlling said waveform display pulse signal so as to be applied to said video amplifier every other field during the display of said audio signal.

2. A television receiver according to claim 1, wherein said signal converting means comprises means for generating a sawtooth wave signal in synchronism with a horizontal pulse, means for mixing said audio signal with said sawtooth wave signal, means for clipping the output signal of said mixing means to generate a phase-modulated signal, and means for differentiating said phase-modulated signal to develop the waveform display pulse signal whose phase position is corresponding to said audio signal.

3. A television receiver according to claim 1, wherein said controlling means comprises bistable means triggered by a vertical pulse for generating a control signal, and switching means controlled by the control signal for supplying said waveform display pulse signal to said video amplifier every other field.

* * * * *